(12) United States Patent
Gill

(10) Patent No.: US 6,473,275 B1
(45) Date of Patent: Oct. 29, 2002

(54) DUAL HYBRID MAGNETIC TUNNEL JUNCTION/GIANT MAGNETORESISTIVE SENSOR

(75) Inventor: Hardayal (Harry) Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 09/588,849

(22) Filed: Jun. 6, 2000

(51) Int. Cl.[7] ................................................. G11B 5/39
(52) U.S. Cl. ..................................... 360/314; 360/324.2
(58) Field of Search ........................... 365/145, 171–173; 360/314, 324.12, 324.2

(56) References Cited

U.S. PATENT DOCUMENTS

| | | | |
|---|---|---|---|
| 5,206,590 A | | 4/1993 | Dieny et al. ................. 324/252 |
| 5,287,238 A | | 2/1994 | Baumgart et al. ........... 360/113 |
| 5,422,571 A | * | 6/1995 | Gurney et al. ............... 324/252 |
| 5,576,915 A | * | 11/1996 | Akiyama et al. ............ 360/314 |
| 5,650,958 A | | 7/1997 | Gallagher et al. ........... 365/173 |
| 5,701,222 A | * | 12/1997 | Gill et al. .................... 360/314 |
| 5,715,121 A | * | 2/1998 | Sakakima et al. ........ 360/324.2 |
| 5,729,410 A | | 3/1998 | Fontana, Jr. et al. ........ 360/113 |
| 5,748,399 A | * | 5/1998 | Gill .............................. 360/314 |
| 5,768,066 A | * | 6/1998 | Akiyama et al. ............ 360/314 |
| 5,859,753 A | * | 1/1999 | Ohtsuka et al. ............. 360/314 |
| 5,862,022 A | * | 1/1999 | Noguchi et al. ............. 257/421 |
| 5,901,018 A | * | 5/1999 | Fontana et al. ........... 360/324.2 |
| 5,973,334 A | * | 10/1999 | Mizushima et al. ........... 257/25 |
| 6,211,559 B1 | * | 4/2001 | Zhu et al. ..................... 257/295 |
| 6,226,160 B1 | * | 5/2001 | Gallagher et al. ........ 360/324.2 |
| 6,301,089 B1 | * | 10/2001 | Saito et al. .................. 360/314 |
| 6,303,218 B1 | * | 10/2001 | Kamiguchi et al. ......... 360/313 |
| 6,317,297 B1 | * | 11/2001 | Tong et al. .................. 360/314 |

* cited by examiner

*Primary Examiner*—Brian E. Miller
(74) *Attorney, Agent, or Firm*—William D. Gill

(57) ABSTRACT

A dual hybrid magnetic tunnel junction (MTJ)/giant magnetoresistance (GMR) sensor is provided having an MTJ stack, a GMR stack and a common free layer. The MTJ stack includes a first antiferromagnetic (AFM) layer, an first antiparallel (AP)-pinned layer and a tunnel barrier layer. The GMR stack, operating in the current perpendicular to the plane (CPP) mode, includes a second AFM layer, a second AP-pinned layer and a spacer layer. The first and second AFM layers are set to pin the magnetizations of the first and second AP-pinned layers perpendicular to the ABS and in the same direction with respect to each other resulting in an additive response to a signal field of the MTJ and GMR stacks. The thickness of the spacer layer in the GMR stack is chosen to provide a negative ferromagnetic coupling field between the second AP-pinned layer and the free layer which opposes the positive ferromagnetic coupling field between the first AP-pinned layer and the free layer across the tunnel barrier layer. The net ferromagnetic coupling field at the free layer can be reduced to a small value resulting in an improved bias point for the free layer of the MTJ/GMR sensor.

38 Claims, 11 Drawing Sheets

DUAL HYBRID MAGNETIC TUNNEL JUNCTION/GIANT MAGNETORESISTIVE SENSOR

BACKGROUND OF THE INVENTION

1. Field of the Invention

This invention relates in general to magnetic tunnel junction transducers for reading information signals from a magnetic medium and, in particular, to a dual hybrid magnetic tunnel junction/giant magnetoresistive sensor and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a nonmagnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier layer 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

Dual SV or MTJ sensors can provide increased magnetoresistive response to a signal field due to the additive response of the dual sensors. IBM's U.S. Pat. No. 5,287,238 granted to Baumgart et al. discloses a dual SV sensor. FIG. 3 shows a dual spin valve sensor 300 wherein the spin valve structure is doubled symmetrically with respect a ferromagnetic free layer 308. The structure of the dual spin valve sensor is AFM1/Pinned1/Spacer1/Free/Spacer2/Pinned2/AFM2 providing ferromagnetic first and second pinned layers 304 and 312 separated by nonmagnetic first and second spacer layers 306 and 310, respectively, from a ferromagnetic free layer 308 which allows utilization of the conduction electrons scattered in both directions from the intermediate free layer 308. The directions of magnetization 305 and 313 (tails of arrows pointing into the plane of the paper) of the first and second pinned layers 304 and 312 are fixed parallel to each other by adjacent first and second antiferromagnetic layers 302 and 314, respectively. The direction of magnetization 309 of the free layer 308 is set at an angle of about 90° with respect to the magnetizations of the two pinned layers and is allowed to rotate freely in response to an applied magnetic field.

Dual MTJ sensors, having insulating tunnel barrier layers in place of the conducting spacer layers of the dual SV sensor structure of FIG. 3, are of interest for their potential for high tunnel magnetoresistance response to an applied magnetic field. However, a ferromagnetic coupling field between the free layer and the pinned layers across the $Al_2O_3$ tunnel junction layers is usually very large (>20 Oe) because the tunnel junction layers are very thin. The coupling field from the two junctions add at the free layer making it difficult to achieve a proper bias angle for the free layer.

Therefore, there is a need for a dual MTJ sensor that provides the advantages of improved magnetoresitive coefficient without the problems associated with ferromagnetic coupling between the free layer and the pinned layers.

SUMMARY OF THE INVENTION

It is an object of the present invention to disclose a dual hybrid magnetoresistive sensor having a magnetic tunnel junction (MTJ) structure and a giant magnetoresistive (GMR) structure operating in the current perpendicular to the plane (CPP) mode.

It is another object of the present invention to disclose a dual hybrid MTJ/GMR sensor having a structure which reduces or essentially eliminates the net ferromagnetic coupling field between the free layer and the pinned layers.

It is a further object of the present invention to disclose a dual hybrid MTJ/GMR sensor having a structure that results in an improved bias point for the free layer.

In accordance with the principles of the present invention, there is disclosed a dual hybrid MTJ/GMR sensor comprising an MTJ stack separated from a GMR stack by a ferromagnetic free layer. Electrodes for providing sense current to the hybrid MTJ/GMR sensor are provided by a first shield and a second shield. Sense current flow is perpendicular to the plane (CPP) mode in both the MTJ stack and the GMR stack of the sensor.

The MTJ stack has an antiparallel (AP)-pinned layer separated from the free layer by an electrically insulating tunnel barrier layer. A first antiferromagnetic (AFM) layer adjacent to the first AP-pinned layer provides an exchange field to fix (pin) the magnetization direction of the first AP-pinned layer perpendicular to the ABS. The GMR stack has a second AP-pinned layer separated from the free layer by an electrically conductive spacer layer. A second AFM layer adjacent to the second AP-pinned layer provides an exchange field to pin the magnetization direction of the second AP-pinned layer perpendicular to the ABS.

The first AP-pinned layer comprises a first ferromagnetic (FM) layer adjacent to the first AFM layer, a second FM layer adjacent to the tunnel barrier layer and an antiparallel coupling (APC) layer sandwiched between the first and second FM layers. The second AP-pinned layer comprises a third FM layer adjacent to the spacer layer, a fourth FM layer and an APC layer sandwiched between the third and fourth FM layers. The second AFM layer is disposed adjacent to the fourth FM layer.

The first and second AFM layers have their magnetizations set in the same direction which results in the magnetization directions of the second and third FM layers adjacent to the tunnel junction layer and the spacer layer, respectively, to be parallel. Since the magnetoresistive responses of the MTJ stack and the GMR stack are functions of the relative orientations of the magnetizations of the second and third FM layers, respectively, with respect to the magnetization of the free layer, having the second and third FM layers pinned parallel to each other results in an additive response to a signal field of the MTJ and GMR stacks in the dual hybrid sensor.

An advantage of having the first and second AFM layers set in the same direction is that the same antiferromagnetic material may be used to form both layers and both layers can be set in the same process during fabrication.

A further advantage of the dual hybrid MTJ/GMR sensor is obtained by choosing the thickness of the spacer layer to provide negative ferromagnetic coupling between the third FM layer and the free layer across the spacer layer of the GMR stack. This negative coupling opposes the positive coupling between the second FM layer and the free layer across the tunnel barrier layer of the MTJ stack. It is known to the art that at low thicknesses of the electrically conductive spacer layer the ferromagnetic coupling increases and oscillates between positive and negative values. By choosing a thickness for which the ferromagnetic coupling field is negative, the net ferromagnetic coupling field at the free layer can be reduced to a small value resulting in an improved bias point for the free layer of the dual hybrid MTJ/GMR sensor.

The above as well as additional objects, features, and advantages of the present invention will become apparent in the following detailed description.

BRIEF DESCRIPTION OF THE DRAWINGS

For a fuller understanding of the nature and advantages of the present invention, as well as of the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
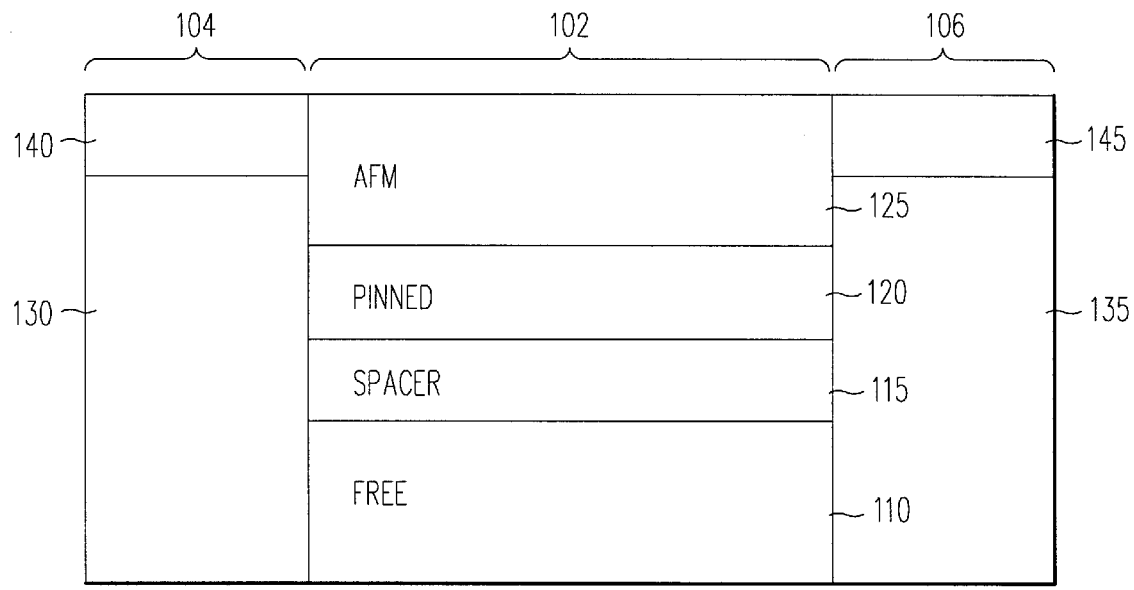
FIG. 1 is an air bearing surface view, not to scale, of a prior art SV sensor.
Figure 3:
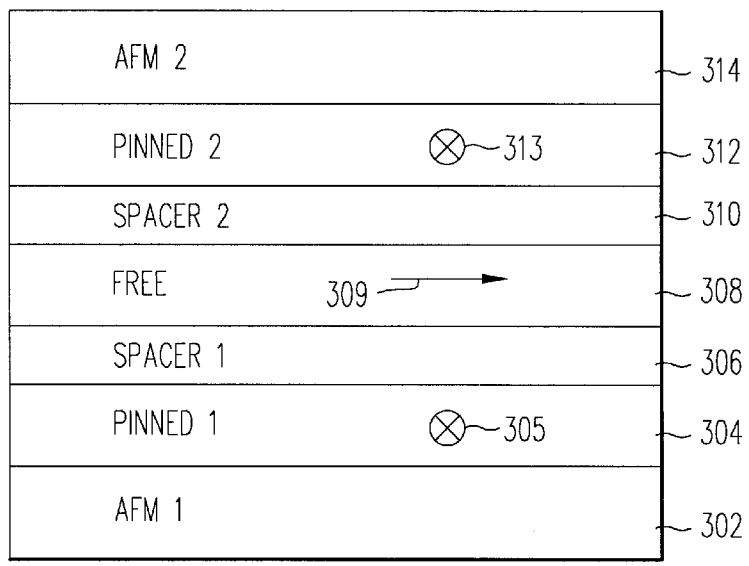
FIG. 3 is an air bearing surface view, not to scale, of a prior art dual spin valve sensor.
Figure 2:
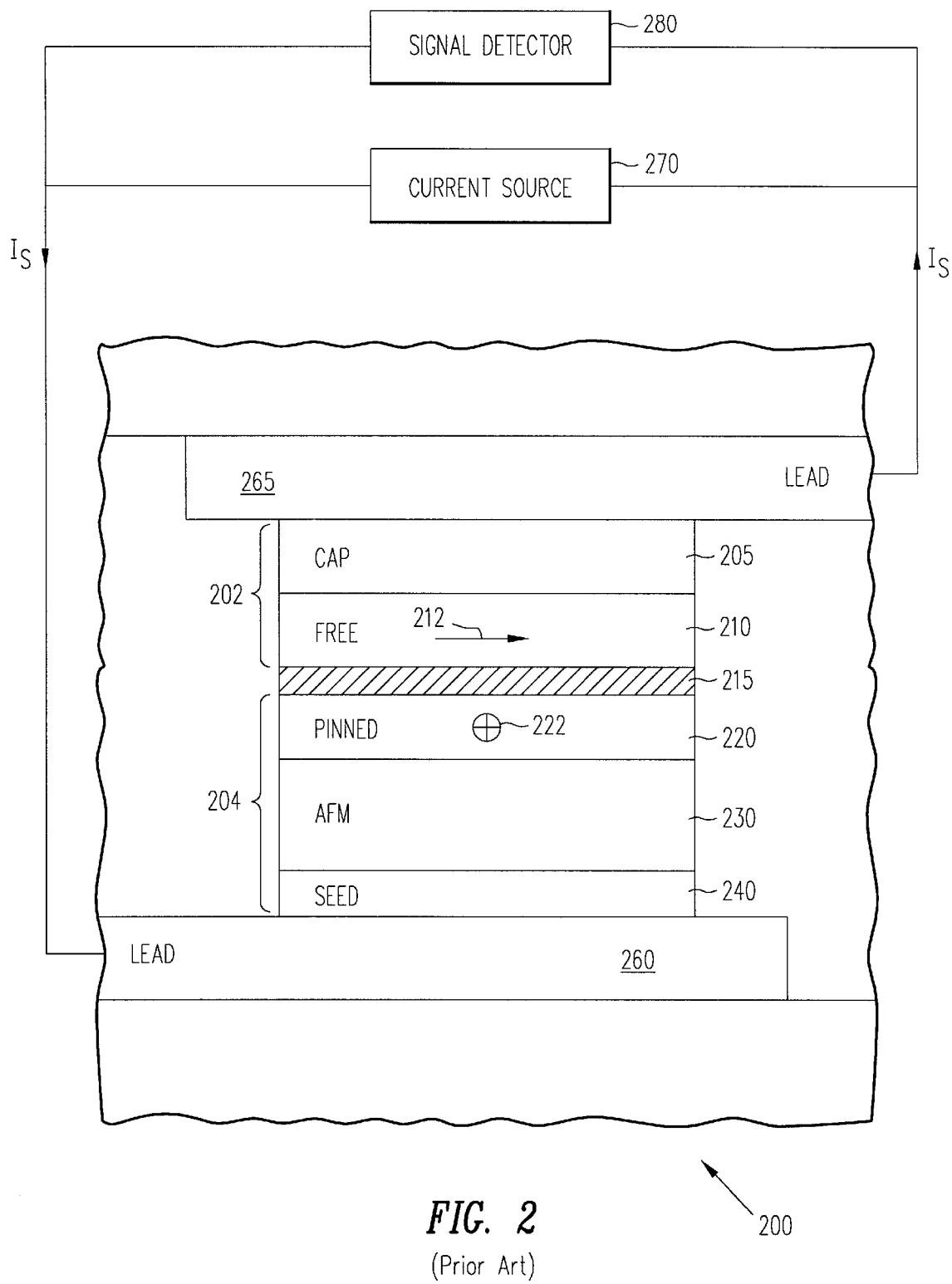
FIG. 2 is an air bearing surface view, not to scale, of a prior art MTJ sensor.
Figure 4:
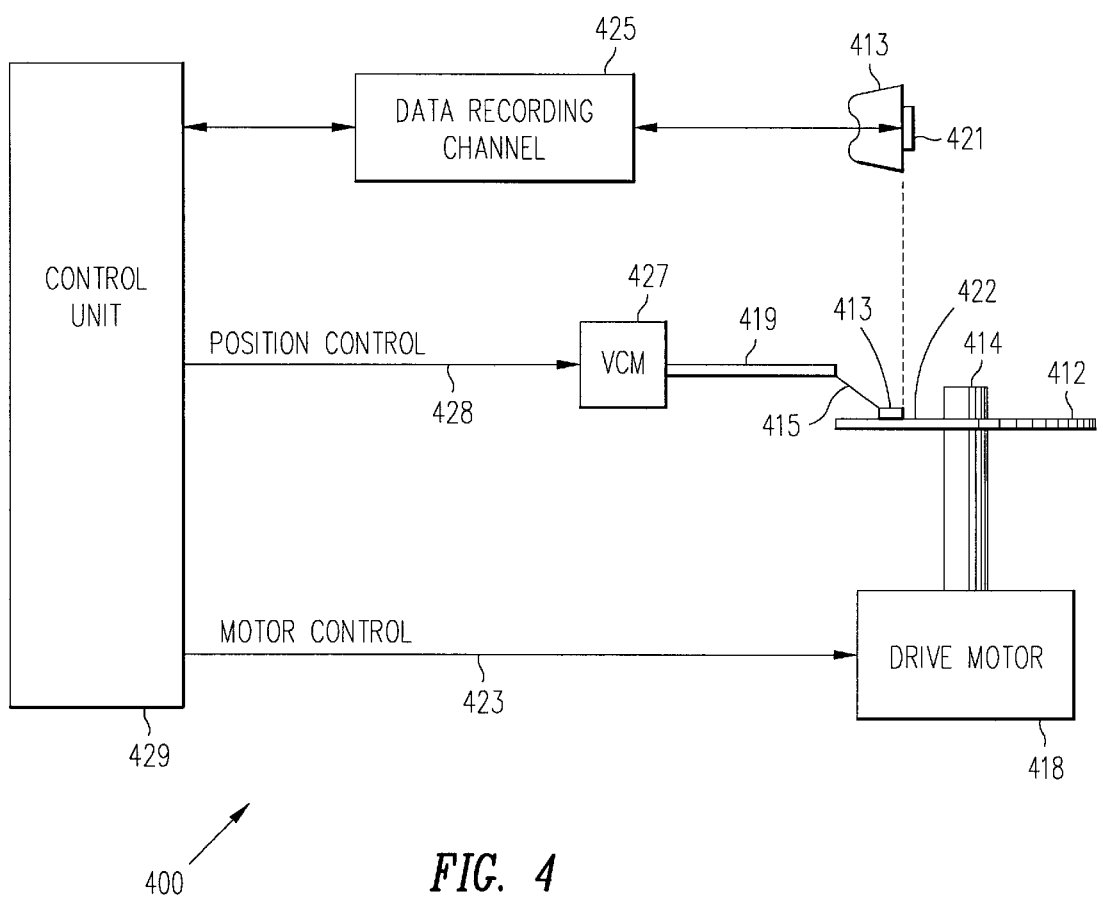
FIG. 4 is a simplified diagram of a magnetic recording disk drive system using the dual hybrid MTJ/GMR sensor of the present invention.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on the disk 412.

At least one slider 413 is positioned on the disk 412, each slider 413 supporting one or more magnetic read/write heads 421 where the head 421 incorporates the SVT sensor of the present invention. As the disks rotate, the slider 413 is moved radially in and out over the disk surface 422 so that the heads 421 may access different portions of the disk where desired data is recorded. Each slider 413 is attached to an actuator arm 419 by means of a suspension 415. The suspension 415 provides a slight spring force which biases the slider 413 against the disk surface 422. Each actuator arm 419 is attached to an actuator 427. The actuator as shown in FIG. 4 may be a voice coil motor (VCM). The VCM comprises a coil movable within a fixed magnetic field, the direction and speed of the coil movements being controlled by the motor current signals supplied by a controller 429.

During operation of the disk storage system, the rotation of the disk 412 generates an air bearing between the slider 413 (the surface of the slider 413 which includes the head 421 and faces the surface of the disk 42 is referred to as an air bearing surface (ABS)) and the disk surface 422 which exerts an upward force or lift on the slider. The air bearing thus counter-balances the slight spring force of the suspension 415 and supports the slider 43 off and slightly above the disk surface by a small, substantially constant spacing during normal operation.

The various components of the disk storage system are controlled in operation by control signals generated by the control unit 429, such as access control signals and internal clock signals. Typically, the control unit 429 comprises logic control circuits, storage chips and a microprocessor. The control unit 429 generates control signals to control various system operations such as drive motor control signals on line 423 and head position and seek control signals on line 428. The control signals on line 428 provide the desired current profiles to optimally move and position the slider 413 to the desired data track on the disk 412. Read and write signals are communicated to and from the read/write heads 421 by means of the recording channel 425. Recording channel 425 may be a partial response maximum likelihood (PMRL) channel or a peak detect channel. The design and implementation of both channels are well known in the art and to persons skilled in the art. In the preferred embodiment, recording channel 425 is a PMRL channel.

The above description of a typical magnetic disk storage system, and the accompanying illustration of FIG. 4 are for representation purposes only. It should be apparent that disk storage systems may contain a large number of disks and actuator arms, and each actuator arm may support a number of sliders.

Figure 5A:
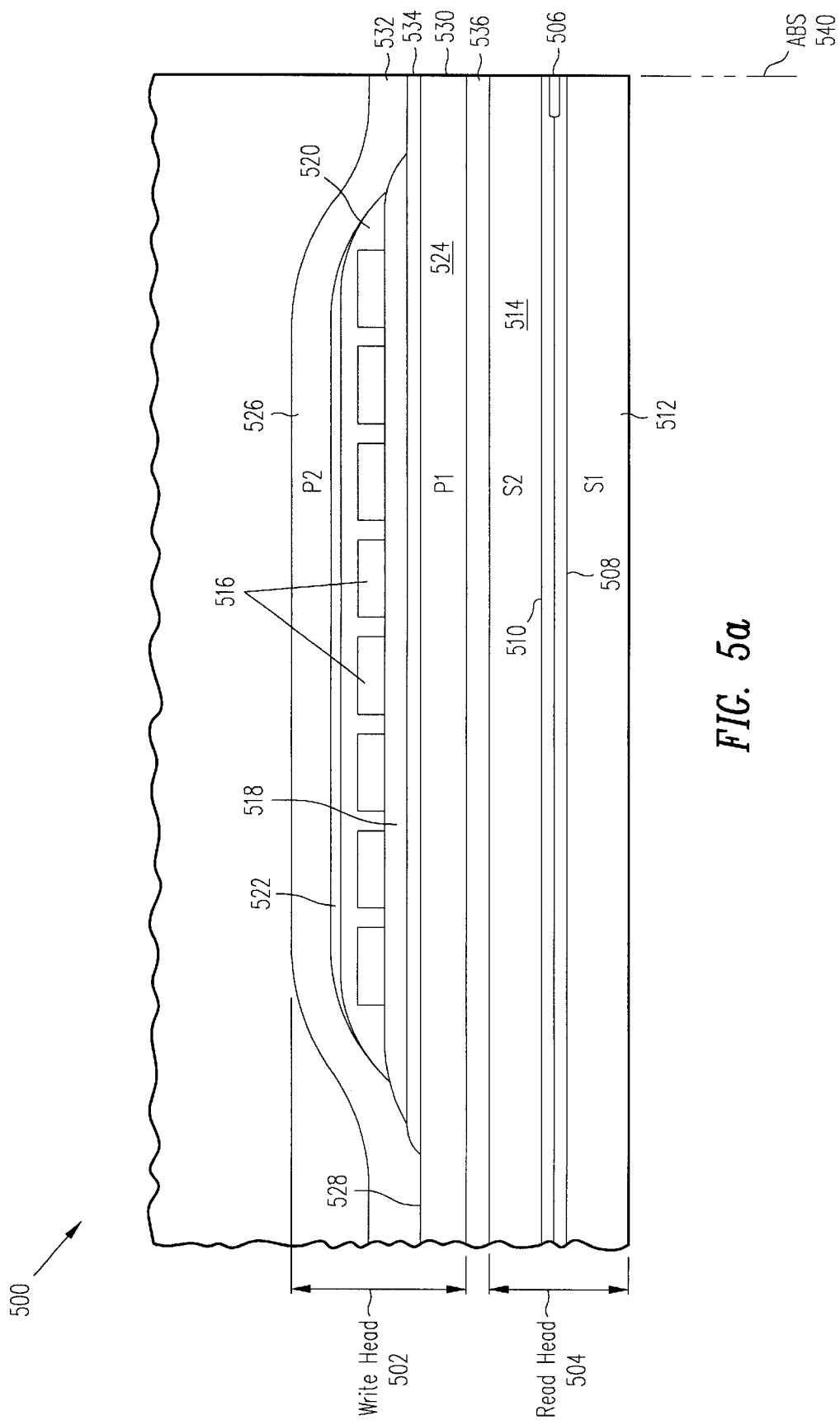
FIG. 5a is a vertical cross-section view, not to scale, of a "piggyback" read/write magnetic head.

FIG. 5a is a side cross-sectional elevation view of a "piggyback" magnetic read/write head 500, which includes a write head portion 502 and a read head portion 504, the read head portion employing a dual hybrid MTJ/GMR sensor 506 according to the present invention. The SVT sensor 506 is sandwiched between nonmagnetic insulative first and second read gap layers 508 and 510, and the read gap layers are sandwiched between ferromagnetic first and second shield layers 512 and 514. In response to external magnetic fields, the resistance of the SVT sensor 506 changes. A sense current $I_s$ conducted through the sensor causes these resistance changes to be manifested as potential changes. These potential changes are then processed as readback signals by the processing circuitry of the data recording channel 446 shown in FIG. 4.

The write head portion 502 of the magnetic read/write head 500 includes a coil layer 516 sandwiched between first and second insulation layers 518 and 520. A third insulation layer 522 may be employed for planarizing the head to eliminate ripples in the second insulation layer 520 caused by the coil layer 516. The first, second and third insulation layers are referred to in the art as an insulation stack. The coil layer 516 and the first, second and third insulation layers 518, 520 and 522 are sandwiched between first and second pole piece layers 524 and 526. The first and second pole piece layers 524 and 526 are magnetically coupled at a back gap 528 and have first and second pole tips 530 and 532 which are separated by a write gap layer 534 at the ABS 540. An insulation layer 536 is located between the second shield layer 514 and the first pole piece layer 524. Since the second shield layer 514 and the first pole piece layer 54 are separate layers this read/write head is known as a "piggyback" head.

Figure 5B:
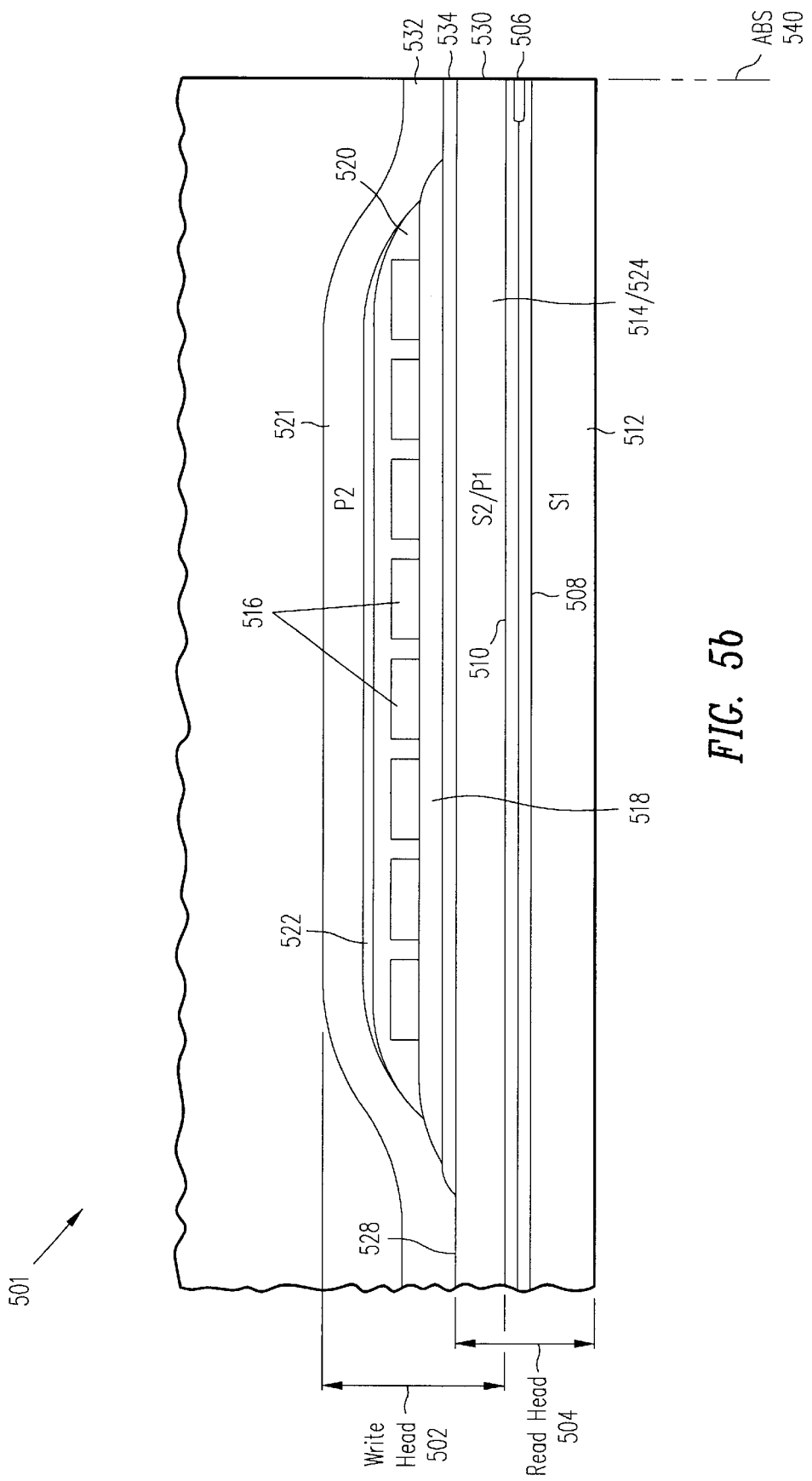
FIG. 5b is a vertical cross-section view, not to scale, of a "merged" read/write magnetic head.

FIG. 5b is the same as FIG. 5a except the second shield layer 514 and the first pole piece layer 524 are a common layer. This type of read/write head is known as a "merged" head 501. The insulation layer 536 of the piggyback head in FIG. 5a is omitted in the merged head 501 of FIG. 5b.

Figure 6:
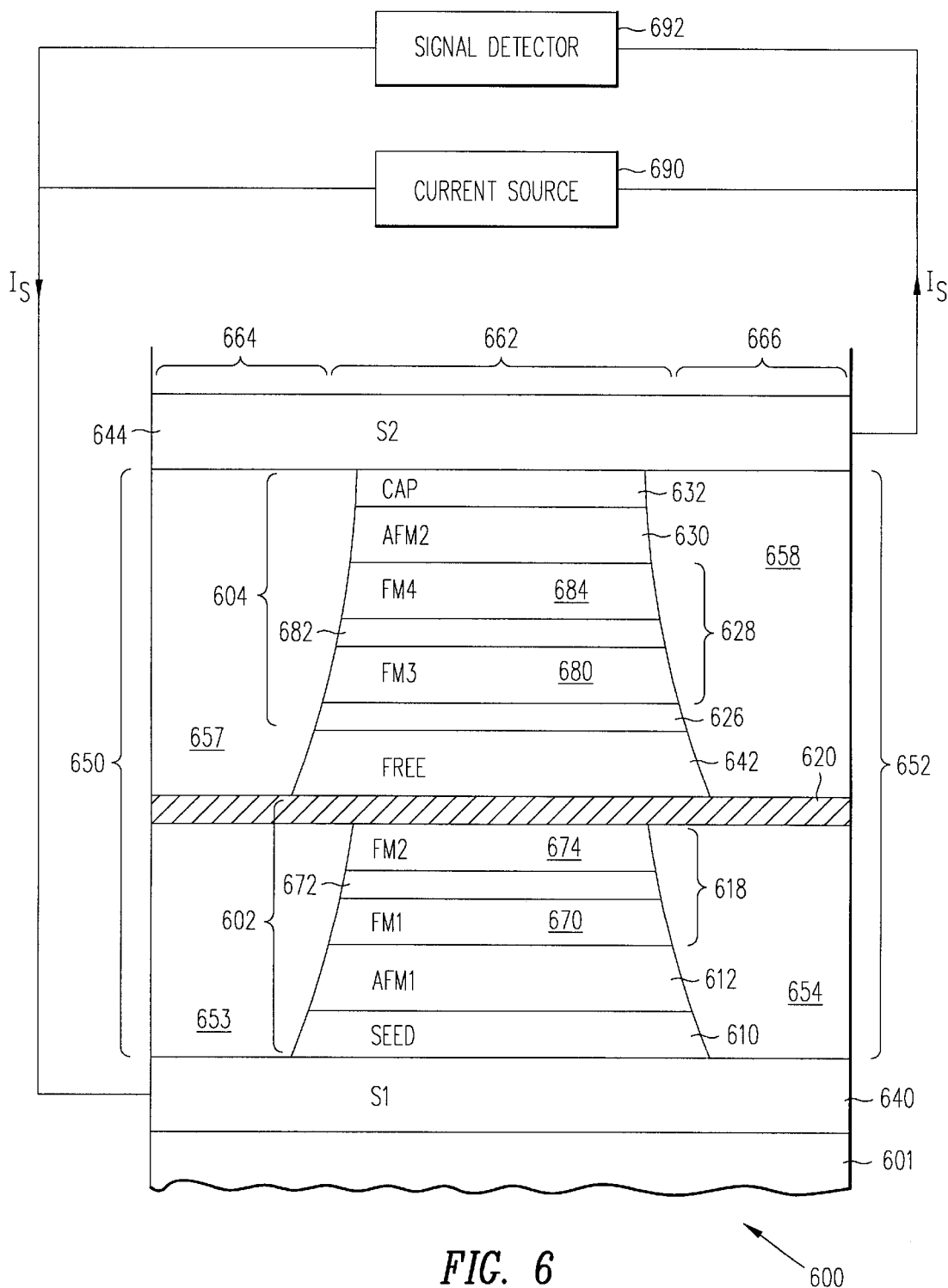
FIG. 6 is an air bearing surface view, not to scale, of a first embodiment of the dual hybrid MTJ/GMR sensor of the present invention.

FIG. 6 shows an air bearing surface (ABS) view, not to scale, of a dual hybrid MTJ/GMR sensor 600 according to a preferred embodiment of the present invention. The MTJ/GMR sensor 600 comprises passive end regions 664 and 666 separated from each other by an active central region 662. The active region of the MTJ/GMR sensor comprises an MTJ stack 602 and a GMR stack 604 formed in the central region 662. The MTJ stack 602 is formed directly on a first shield (S1) 640 in the central region 662. The first shield 640 is a layer of soft ferromagnetic material such as Ni—Fe (permalloy), or alternatively Al—Fe—Si (Sendust), deposited on a substrate 601 and extending over the central region 662 and the end regions 664 and 666 to provide magnetic shielding of the MTJ/GMR sensor 600 from stray magnetic fields.

The MTJ stack 602 comprises a first AP-pinned layer 618, a tunnel barrier layer 620 disposed between a ferromagnetic free layer 642 and the first AP-pinned layer 618, a seed layer 610 and a first antiferromagnetic (AFM) layer 612 disposed between the first AP-pinned layer 618 and the seed layer 610. The first AFM layer 612 is exchange coupled to the first AP-pinned layer 618 providing an exchange field to pin the magnetization direction of the first AP-pinned layer 618 perpendicular to the ABS. The first AP-pinned layer 618 comprises a first ferromagnetic (FM) layer 670 adjacent to the first AFM layer 612, a second FM layer 674 and an antiferromagnetic coupling (APC) layer 672 sandwiched between the first and second FM layers 670 and 674. The APC layer 672 is formed of a nonmagnetic material, preferably ruthenium (Ru), that allows the first and second FM layers 670 and 674 to be strongly coupled together antiferromagnetically.

The GMR stack 604 comprises a second AP-pinned layer 628, a conductive spacer layer 626 disposed between the free layer 642 and the second AP-pinned layer 628, a cap layer 632 and a second AFM layer 630 disposed between the second AP-pinned layer 628 and the cap layer 632. The second AFM layer 630 is exchange coupled to the second AP-pinned layer 628 providing an exchange field to pin the magnetization direction of the second AP-pinned layer 628 perpenciuilar to the ABS. The second AP-pinned layer 628 comprises a third FM layer 680 adjacent to the free layer 642, a fourth FM layer 684, and an APC layer 682 sandwiched between the third and fourth FM layers 680 and 684. The APC layer 682 is formed of a nonmagnetic material, preferably ruthenium (Ru), that allows the third and fourth FM layers 680 and 684 to be strongly coupled together antiferromagnetically.

The ferromagnetic free layer 642 sandwiched between the tunnel barrier layer 620 and the spacer layer 626 provides a shared free layer for the MTJ stack 602 and the GMR stack 604 of the dual hybrid MTJ/GMR sensor 600. The magnetization of the free layer 642 is oriented parallel to the ABS and is free to rotate in the presence of a magnetic field.

Insulator layers 650 and 652 of electrically insulating material such as $Al_2O_3$ are formed in the end regions 664 and 666, respectively, on the first shield 640 and in abutting contact with the MTJ stack 602, the GMR stack 604 and the free layer 642. A second shield (S2) 644 of soft ferromagnetic material such as Ni—Fe, or alternatively Al—Fe—Si, is formed over the insulator layers 650 and 652 in the end regions 664 and 666, repectively, and over the GMR stack 604 in the central region 662.

If longitudinal stabilization of the magnetic domain states of the free layer 642 is desired, hard bias layers may be provided in the end regions 664 and 666 as is known in the art. IBM's U.S. Pat. No. 5,729,410 granted to Fontana et al., and incorporated herein by reference, describes such a longitudinal biasing method for an MTJ sensor.

The MTJ sensor 600 may be fabricated in a magnetron sputtering or an ion beam sputtering system to sequentially deposit the multilayer structure shown in FIG. 6. The first shield 640 of Ni—Fe having a thickness in the range of 5000–10000 Å is deposited on the substrate 601. The seed layer 610, the first AFM layer 612, and the first AP-pinned layer 618 are sequentially deposited over the first shield 640 in the presence of a longitudinal or transverse magnetic field of about 40 Oe to orient the easy axes of all the ferromagnetic layers. The seed layer 610 is a layer deposited to modify the crystallographic texture or grain size of the subsequent layers, and may not be needed depending on the material of the subsequent layer. In the preferred embodiment, the seed layer 610 is formed of Ni—Mn—O, or alternatively of Ta, having a thickness of 30 Å deposited on the first shield 640 and a Co—Fe layer having a thickness of 10 Å deposited on the Ni—Mn—O layer. The first AFM layer 612 formed of Pt—Mn, or alternatively Ir—Mn, Pt—Pd—Mn, or Ni—Mn, having a thickness of about 60 Å is deposited on the seed layer 610. The first FM layer 670 formed of Co—Fe having a thickness in the range of 20–50 Å is deposited on the first AFM layer 612. The APC layer 672 preferably formed of ruthenium (Ru) having a thickness of about 6 Å is deposited on the first FM layer 670. The second FM layer 674 formed of Co—Fe having a thickness in the range of 20–50 Å is deposited on the APC layer 672. The thickness of the second FM layer 674 is chosen to be greater than the thickness of the first FM layer 670 so that the direction of the net magnetization of the first AP-pinned layer 618 has the same direction as the magnetization direction of the second FM layer 674.

The bottom layers of the MTJ stack 602 are defined in the central region 662 by depositing a photoresist and using photolithography and ion milling processes well known in the art. The bottom portions 653 and 654 of insulator layers 650 and 652 can now be deposited on the first shield 640 in the end regions 664 and 666, respectively. The insulator layers 653 and 654 are formed of $Al_2O_3$ having a thickness approximately equal to the total thickness of the seed layer 610, the first AFM layer 612 and the first AP-pinned layer 618. The photoresist protecting the bottom layers of the MTJ stack 602 is then removed and the tunnel barrier layer 620 is formed of $Al_2O_3$ by depositing and then plasma oxidizing an 8–20 Å aluminum (Al) layer on the second FM layer 674 in the central region 662 and on the insulator layers 653 and 654 in the edge regions 664 and 666.

The ferromagnetic free layer 642 is deposited in the central region 662 over the tunnel barrier layer 620 in the presence of a longitudinal or transverse magnetic field of about 40 Oe to orient the easy axes of the ferromagnetic layer. The free layer 642 is formed of Ni—Fe having a thickness in the range of 20–40 Å. Alternatively, the free layer 642 may be formed of a laminated multilayer comprising a ferromagnetic first interface layer formed of cobalt (Co) having a thickness of about 5 Å deposited on the first tunnel barrier layer 620, a ferromagnetic layer formed of Ni—Fe having a thickness in the range of 20–30 Å deposited on the first interface layer, and a ferromagnetic second interface layer formed of Co having a thickness of about 5 Å deposited on the ferromagnetic Ni—Fe layer.

The spacer layer 626 preferably formed of copper (Cu) having a thickness in the range of 19–24 Å, or alternatively, of silver (Ag) or gold (Au) or of alloys of Cu, Ag and Au, is deposited on the free layer 642. The thickness of the spacer layer 626 is chosen to result in negative ferromagnetic coupling across the spacer layer as discussed in detail below.

The third FM layer 680 formed of Co—Fe having a thickness in the range of 20–50 Å is deposited on the spacer layer 626. The APC layer 682 preferably formed of ruthenium (Ru) having a thickness of about 6 Å is deposited on the third FM layer 680. The fourth FM layer 684 formed of Co—Fe having a thickness in the range of 20–50 Å is deposited on the APC layer 682. The thickness of the third FM layer 680 is chosen to be greater than the thickness of the fourth FM layer 684 so that the direction of the net magnetization of the second AP-pinned layer 628 has the same direction as the magnetization direction of the third FM layer 680. The AFM2 layer 630 formed of Pt—Mn, or alternatively Ir—Mn, Pt—Pd—Mn, or Ni—Mn, having a thickness of about 60 Å is deposited on the fourth FM layer 684. The cap layer 632 formed of tantalum (Ta) having a thickness of about 50 Å is deposited on the AFM2 layer 630.

The free layer 642 and the GMR stack 604 are defined in the central region 662 by depositing a photoresist and using photolithography and ion milling processes well known in the art. The top portions 657 and 658 of insulator layers 650 and 652 can now be deposited on the tunnel barrier layer 620 in the end regions 664 and 666, respectively. The insulator layers 657 and 658 are formed of $Al_2O_3$ having a thickness approximately equal to the total thickness of the free layer 642 and the GMR stack 604. The photoresist protecting the GMR stack 604 is removed and the second shield 644 of Ni—Fe having a thickness in the range of 5000–10000 Å is formed on the top portions 657 and 658 of insulator layers 650 and 652 and on the cap layer 632.

Figure 7:
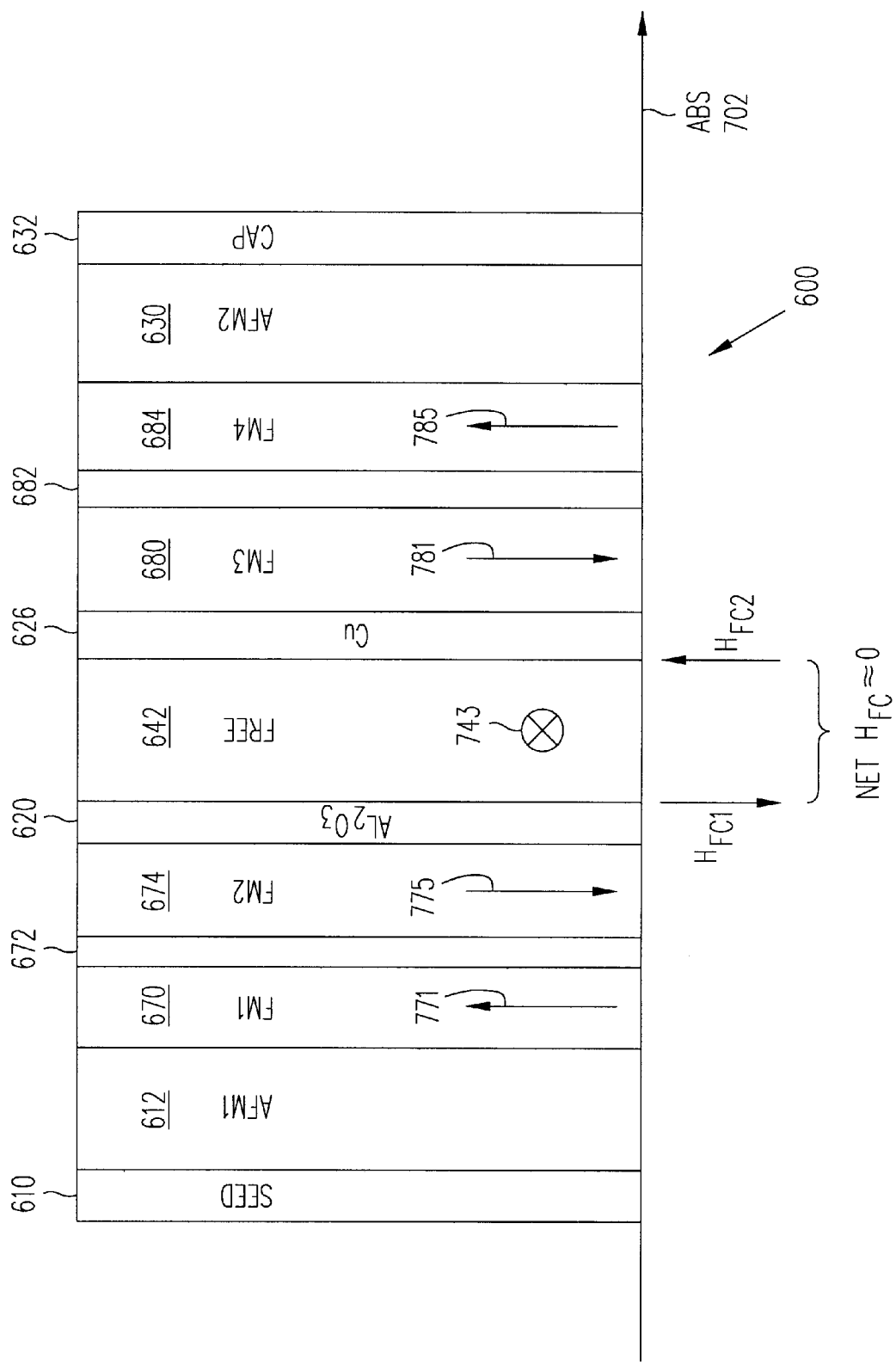
FIG. 7 is a side cross-section view, not to scale, of a first embodiment of the dual hybrid MTJ/GMR sensor of the present invention.

FIG. 7 shows a side cross-section view, not to scale, of the first embodiment of the dual hybrid MTJ/GMR sensor 600 of the present invention. The first and second AFM layers 612 and 630 have their magnetizations set in the same direction which results in the magnetization directions 771 and 785 of the first and fourth FM layers 670 and 684, respectively, being parallel. The magnetization direction 775 of the second FM layer 674 is antiparallel to the magnetization direction 771 of the first FM layer 670 due to the APC layer 672 which causes the first and second FM layers to be strongly antiferromagnetically coupled. The magnetization direction 781 of the third FM layer 680 is antiparallel to the magnetization direction 785 of the fourth FM layer 684 due to the APC layer 682 which causes the third and fourth FM layers to be strongly antiferromagnetically coupled. As a result, the magnetization directions 775 and 781 of the second and third FM layers 674 and 680, respectively, are parallel. The magnetization direction 743 (shown as the tail of an arrow pointing into the plane of the paper) of the free layer 642 is parallel to the ABS 702 and approximately perpendicular to the magnetizations 775 and 781 of the second and third FM layers, respectively. Therefore, rotation of the magnetization 743 of the free layer 642 due to an external field results in the response of the MTJ stack 602 and the GMR stack 604 being additive.

A further advantage of the dual hybrid MTJ/GMR sensor 600 of the present invention is reduction of the net ferromagnetic coupling of the second and third FM layers 674 and 680 to the free layer 642 achieved by having negative ferromagnetic coupling across the spacer layer 626. FIG. 7 illustrates the ferromagnetic coupling fields $H_{FC1}$ and $H_{FC2}$ of the second FM layer 674 to the free layer 642 across the tunnel barrier layer 620 of $Al_2O_3$ and of the third FM layer 680 to the free layer 642 across the spacer layer 626 of Cu, respectively. Because the ferromagnetic coupling across the $Al_2O_3$ tunnel barrier layer is positive, the ferromagnetic coupling field $H_{FC1}$ is oriented in the same direction as the magnetization 775 of the second FM layer 674. By choosing a thickness of the Cu spacer layer 626 that results in the ferromagnetic coupling across the spacer layer 626 being negative, the ferromagnetic coupling field $HFC_2$ is oriented antiparallel to the magnetization 781 of the third FM layer 680. The ferromagnetic coupling fields $H_{FC1}$ and $H_{FC2}$ are antiparallel and, for a suitable choice of thickness of the Cu spacer layer 626, the net ferromagnetic coupling field $H_{FC}=H_{FC1}-H_{FC2}$ acting on the free layer 642 will be approximately zero.

Figure 11:
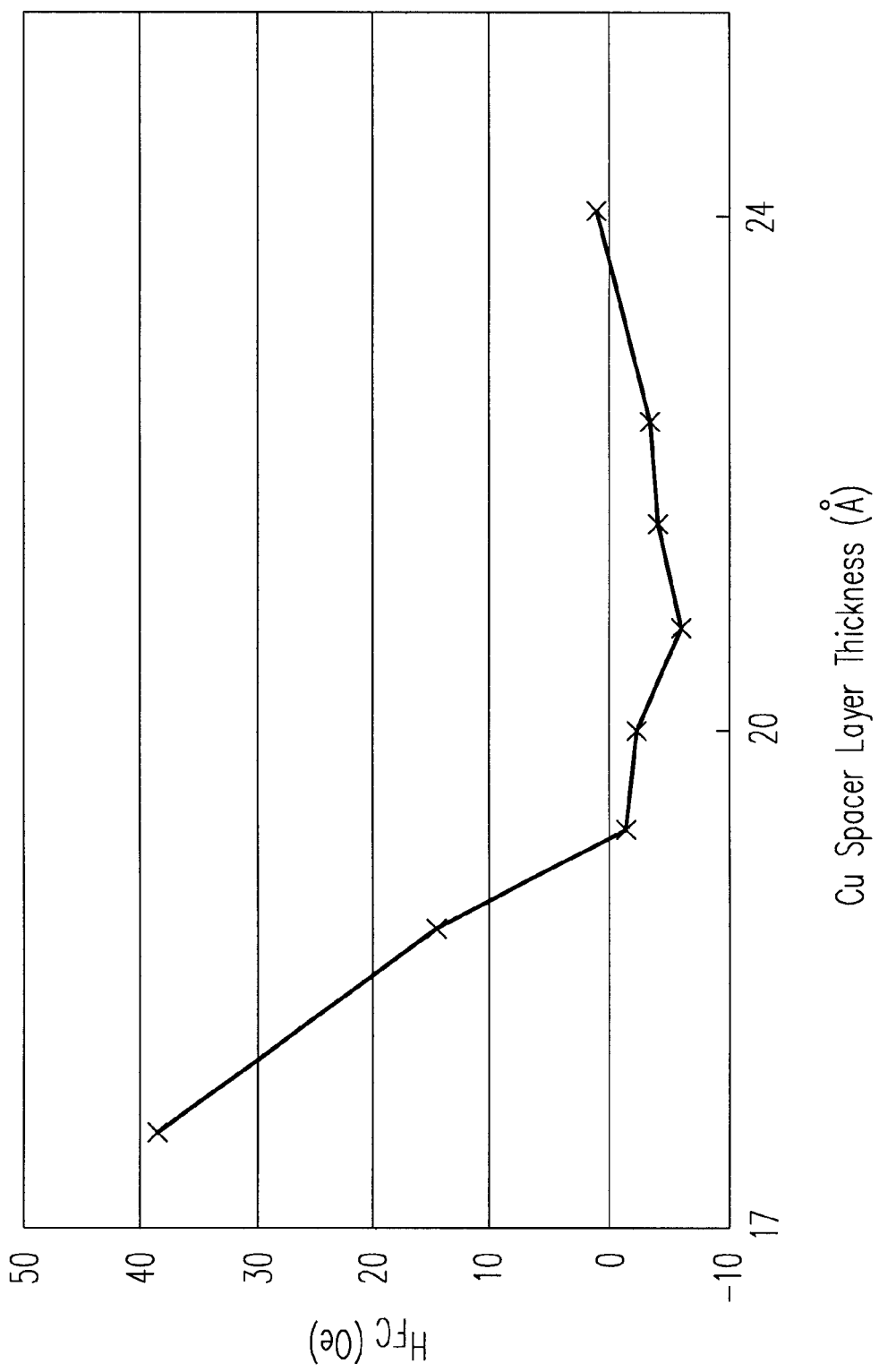
FIG. 11 is a graph of the ferromagnetic coupling field versus copper spacer layer thickness for a Pt—Mn spin valve sensor.

FIG. 11 shows a plot of the ferromagnetic coupling field versus copper spacer layer thickness obtained for spin valve sensors having a Pt—Mn AFM layer. As the thickness of the copper spacer layer is increased the ferromagnetic coupling field decreases from positive values, becoming negative at a copper spacer layer thickness of about 19 Å. The negative ferromagnetic coupling field persists for a copper spacer layer having thickness in a range of 19–24 Å. Negative ferromagnetic coupling fields greater than −20 Oe have been observed in other spin valve sensors.

Figure 10C:
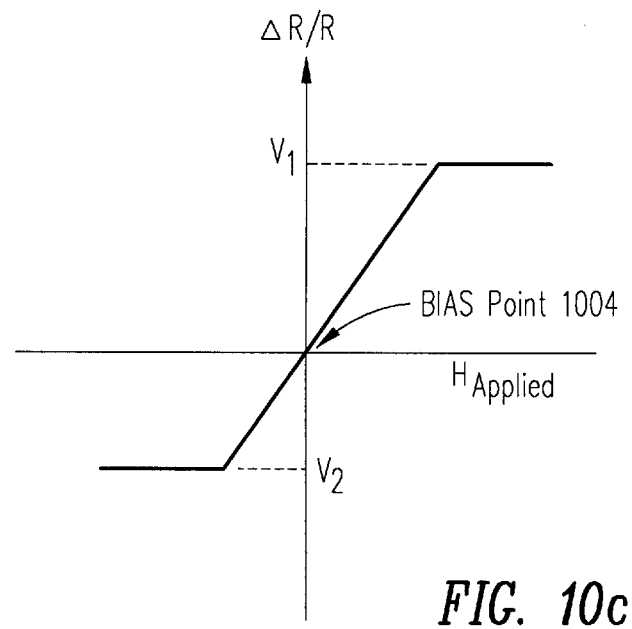
FIG. 10c is a transfer curve for a GMR sensor having a bias point shifted in the negative direction of the transfer curve so that positive and negative readback signals are asymmetrical about the bias point.
Figure 10B:
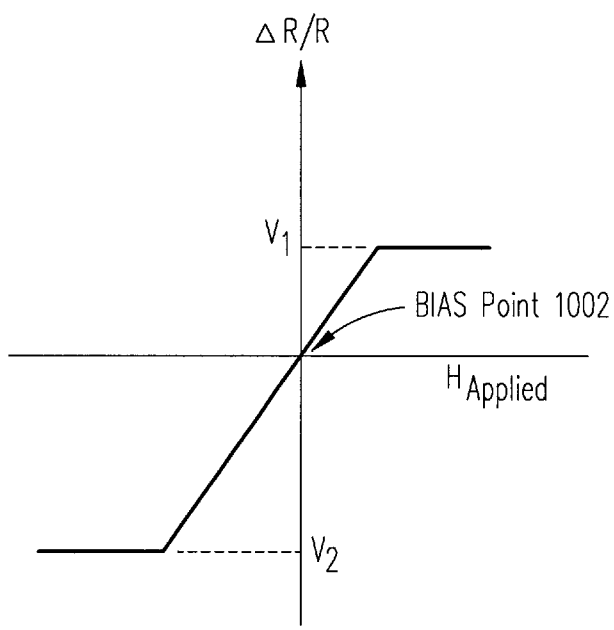
FIG. 10b is a transfer curve for a GMR sensor having a bias point shifted in the positive direction of the transfer curve so that positive and negative readback signals are asymmetrical about the bias point.
Figure 10A:
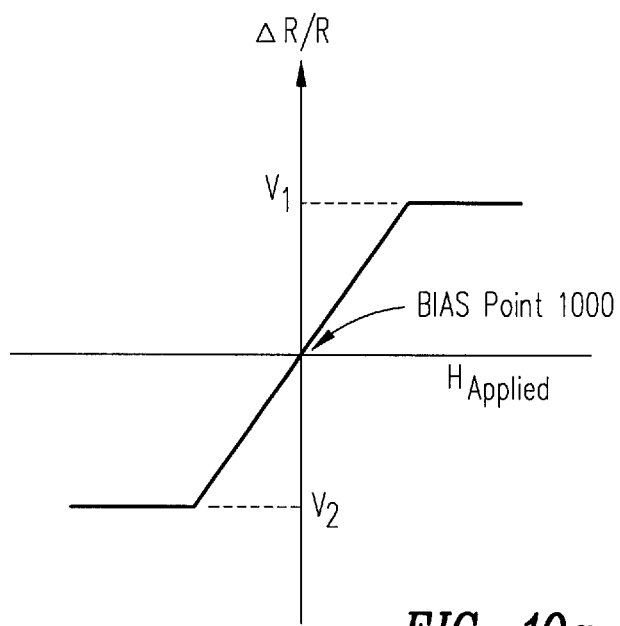
FIG. 10a is a transfer curve for a GMR sensor having a bias point at the midpoint of the transfer curve so that positive and negative readback signals are symmetrical about a zero bias point.

The transfer curve (readback signal of a GMR sensor versus applied signal from the magnetic disk) is linear and is defined by sin θ where θ is the angle between the directions of the magnetizations of the free and pinned layers. FIG. 10a is an exemplary transfer curve for a GMR sensor having a bias point (operating point) 1000 at the midpoint of the transfer curve, at which point the positive and negative readback signals $V_1$ and $V_2$ (positive and negative changes in the GMR of the sensor above and below the bias point) are equal (symmetrical) when sensing positive and negative fields having the same magnitude from the magnetic disk. FIGS. 10b and 10c illustrate transfer curves having bias points 1002 and 1004 shifted in the positive and negative directions, respectively, so that the readback signals $V_1$ and $V_2$ are asymmetrical with respect to the bias point. As is well known in the art, a symmetric bias transfer curve as shown in FIG. 10a is desirable. The desirable symmetric bias transfer curve is obtained when in a quiescent state (no magnetic signal from the disk) the direction of the magnetization of the free layer is perpendicular to the magnetization of the pinned layer which is fixed substantially perpendicular to the disk surface. The bias point may be shifted from the midpoint of the transfer curve by various influences on the free layer which in the quiescent state can act to rotate its magnetization relative to the magnetization of the pinned layer.

One of the major forces influencing the bias point is the ferromagnetic coupling field $H_{FC}$ between the pinned layer and the free layer. The novel feature of the dual hybrid MTJ/GMR sensor 600 of having negative ferromagnetic coupling across the Cu spacer layer 626 resulting in a substantially zero net ferromagnetic coupling field $H_{FC}$ acting on the free layer 642 will result in a significant improvement of the bias point of the sensor by eliminating or reducing this force on the free layer.

Figure 8:
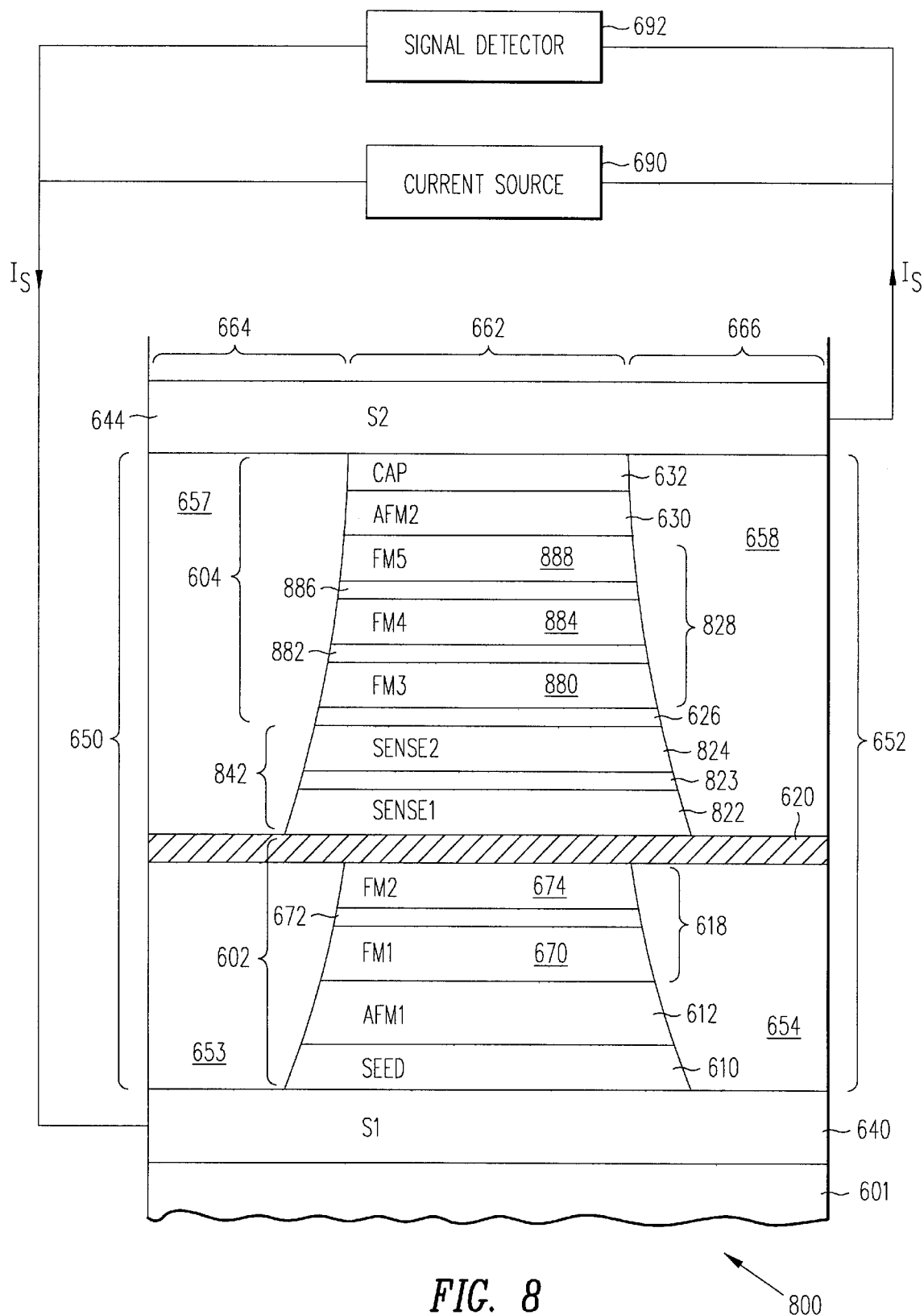
FIG. 8 is an air bearing surface view, not to scale, of a second-embodiment of the dual hybrid MTJ/GMR sensor of the present invention.

FIG. 8 shows an air bearing surface (ABS) view, not to scale, of a dual hybrid MTJ/GMR sensor 800 according to another embodiment of the present invention. The MTJ/GMR sensor 800 differs from the MTJ/GMR sensor 600 shown in FIG. 6 in having a laminated multilayer AP-free layer 842 in place of the simple free layer 642 and having an AP-pinned layer 828 having three FM layers instead of the two FM layers of the AP-pinned layer 628. The AP-free layer 842 comprises first and second sense layers 822 and 824 antiferromagnetically coupled by an APC layer 823. The first sense layer 822 is deposited over the tunnel barrier layer the APC layer 823 is deposited over the first sense layer 822 and the second sense layer 824 is deposited over the APC layer 823. The spacer layer 626 is deposited over the second sense layer 824 and the AP-pinned layer 828 is formed on the spacer layer 626 by sequential deposition of a third FM layer 880, an APC layer 882, a fourth FM layer 884, an APC layer 886 and a fifth FM layer 888. The second AFM layer 630 is deposited over the fifth FM layer 888.

The first and second sense layers 822 and 824 are formed of Ni—Fe having a thickness in the range of 20–40 Å. Alternatively, the first and second sense layers 822 and 824 may be formed of a laminated multilayer comprising a ferromagnetic interface layer formed of cobalt (Co) having a thickness of about 5 Å and a ferromagnetic layer formed of Ni—Fe having a thickness in the range of 20–30 Å. The Co interface layers of the first and second sense layers 822 and 824 interface the tunnel barrier layer 620 and the spacer layer 626, respectively. The thickness of either the first sense layer or the second sense layer is preferably chosen to be greater than the other sense layer to ensure a small net magnetization in a predetermined direction of the free layer 842. The APC layer 823 is preferably formed of ruthenium (Ru) having a thickness of about 6 Å.

Figure 9:
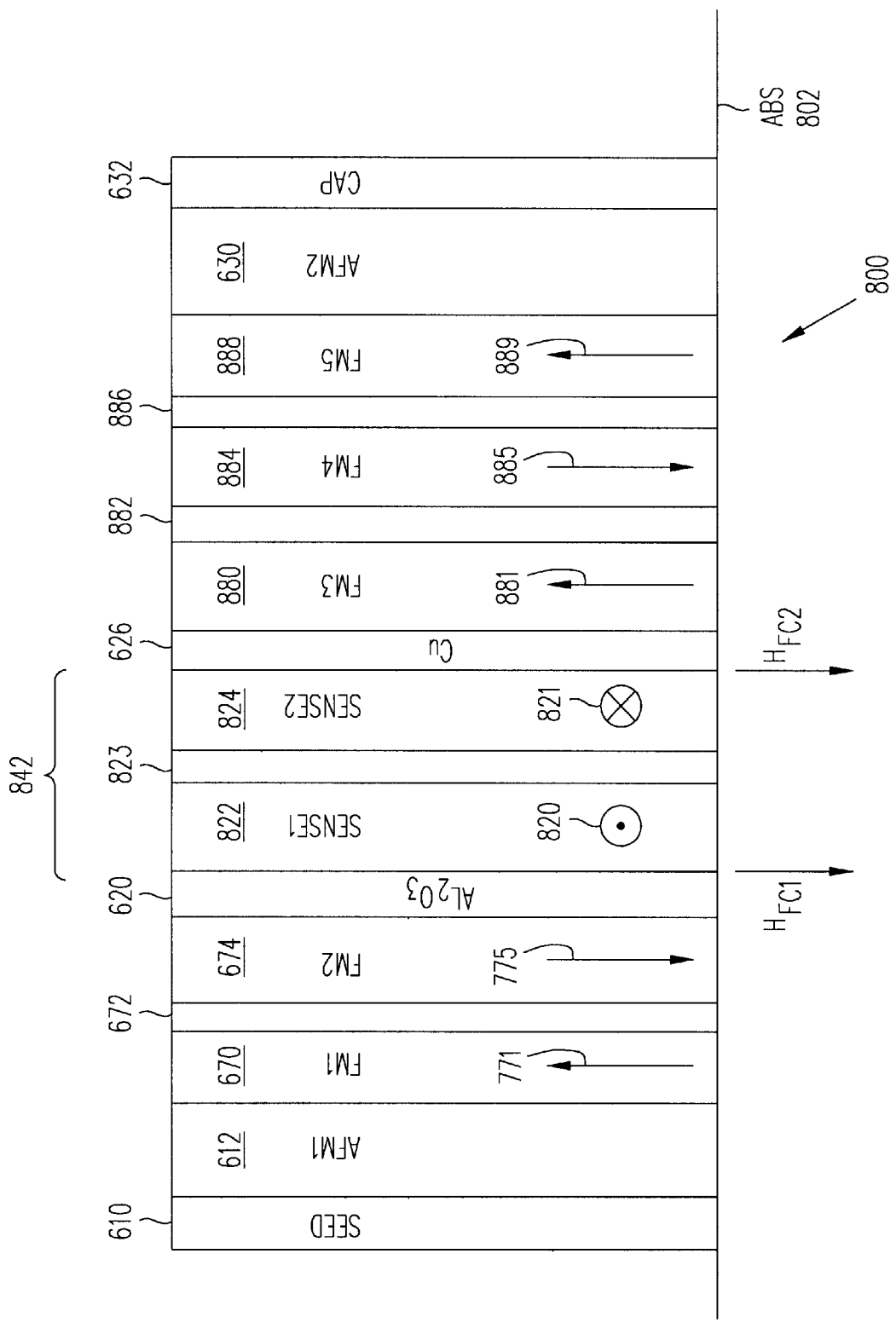
FIG. 9 is a side cross-section view, not to scale, of a second embodiment of the dual hybrid MTJ/GMR sensor of the present invention.

FIG. 9 shows a side cross-section view, not to scale, of the second embodiment of the dual hybrid MTJ/GMR sensor 800 of the present invention. The first and second AFM layers 612 and 630 have their magnetizations set in the same direction which results in the magnetization directions 771 and 989 of the first and fifth FM layers 670 and 888, respectively, being parallel. The magnetization direction 775 of the second FM layer 674 is antiparallel to the magnetization direction 771 of the first FM layer 670 due to the APC layer 672 which causes the first and second FM layers to be strongly antiferromagnetically coupled. The magnetization direction 985 of the fourth FM layer 884 is antiparallel to the magnetization direction 989 of the fifth FM layer 888 due to the APC layer 886 which causes the fourth and fifth FM layers to be strongly antiferromagnetically coupled. The magnetization direction 981 of the third FM layer 880 is antiparallel to the magnetization direction 985 of the fourth FM layer 884 due to the APC layer 882 which causes the third and fourth FM layers to be strongly antiferromagnetically coupled. As a result, the magnetization directions 775 and 981 of the second and third FM layers 674 and 880, respectively, are antiparallel.

The magnetization direction 920 (shown as the point of an arrow pointing out of the plane of the paper) of the first sense layer 822 and the magnetization direction 921 (shown as the tail of an arrow pointing into the plane of the paper) of the second sense layer 824 are antiparallel with respect to each other and are parallel to the ABS 902 and approximately perpendicular to the magnetizations 775 and 981 of the second and third FM layers, respectively. Therefore, because of the antiparallel magnetizations of the second and third FM layers and the antiparallel magnetizations of the first and second sense layers, rotation of the net magnetization of the free layer 842 due to an external field results in the response of the MTJ stack 602 and the GMR stack 604 being additive.

The dual hybrid MTJ/GMR sensor 800 of the second embodiment of the present invention also has the advantage of a reduced net ferromagnetic coupling of the second and third FM layers 674 and 880 to the free layer 842 achieved by having negative ferromagnetic coupling across the spacer layer 626. FIG. 9 illustrates the ferromagnetic coupling fields $H_{FC1}$ and $H_{FC2}$ of the second FM layer 674 to the first sense layer 822 across the tunnel barrier layer 620 of $Al_2O_3$ and of the third FM layer 880 to the second sense layer 824 across the spacer layer 626 of Cu, respectively. Because the ferromagnetic coupling across the $Al_2O_3$ tunnel barrier layer is positive, the ferromagnetic coupling field $H_{FC1}$ is oriented in the same direction as the magnetization 775 of the second FM layer 674. By choosing a thickness of the Cu spacer layer 626 that results in the ferromagnetic coupling across the spacer layer 626 being negative, the ferromagnetic coupling field $H_{FC2}$ is oriented antiparallel to the magnetization 981 of the third FM layer 880. The ferromagnetic coupling fields $H_{FC1}$ and $H_{FC2}$ are parallel but, because $H_{FC1}$ acts to rotate the magnetization 820 of the first sense layer 822 in one direction and $H_{FC2}$ acts to rotate the magnetization 821 of the second sense layer 824 in the opposite direction, the effects of the ferromagnetic coupling fields cancel due to the strong antiparallel coupling of the first and second sense layers. For a suitable choice of thickness of the Cu spacer layer 626, the net effect of the ferromagnetic coupling field $H_{FC1}$ and $H_{FC2}$ acting on the free layer 842 will be approximately zero resulting in an improved bias point for the free layer.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A dual hybrid magnetic tunnel junction (MTJ)/giant magnetoresisive (GMR) sensor, comprising:
   an MTJ stack, including a first AP-pinned layer and a tunnel barrier layer, said tunnel barrier layer adjacent to and in contact with said first AP-pinned layer;
   a GMR stack, including a second AP-pinned layer and a spacer layer, said spacer layer adjacent to and in contact with said second AP-pinned layer; and
   a ferromagnetic free layer disposed between the tunnel barrier layer and the spacer layer.

2. The dual hybrid MTJ/GMR sensor as recited in claim 1 wherein said MTJ stack further comprises a first AFM layer adjacent to said first AP-pinned layer.

3. The dual hybrid MTJ/GMR sensor as recited in claim 2 wherein said first AFM layer is made of Pt—Mn.

4. The dual hybrid MTJ/GMR sensor as recited in claim 2 wherein said first AFM layer is selected from the group of materials consisting of Pt—Mn, Ir—Mn, Pt—Pd—Mn, and Ni—Mn.

5. The dual hybrid MTJ/GMR sensor as recited in claim 1 wherein said GMR stack further comprises a second AFM layer adjacent to said second AP-pinned layer.

6. The dual hybrid MTJ/GMR sensor as recited in claim 5 wherein said second AFM layer is made of Pt—Mn.

7. The dual hybrid MTJ/GMR sensor as recited in claim 5 wherein said first AFM layer is selected from the group of materials consisting of Pt—Mn, Ir—Mn, Pt—Pd—Mn, and Ni—Mn.

8. The dual hybrid MTJ/GMR sensor as recited in claim 1 wherein said tunnel barrier layer is made of $Al_2O_3$.

9. The dual hybrid MTJ/GMR sensor as recited in claim 1 wherein said spacer layer is made of copper (Cu).

10. The dual hybrid MTJ/GMR sensor as recited in claim 9 wherein said spacer layer has a thickness in the range 19–24 Å, said spacer layer providing negative ferromagnetic coupling between said second AP-pinned layer and said free layer.

11. The dual hybrid MTJ/GMR sensor as recited in claim 1 wherein said first AP-pinned layer comprises:
   a first ferromagnetic (FM) layer;

a second FM layer adjacent to said tunnel barrier layer; and an antiparallel coupling (APC) layer disposed between said first and second FM layers.

12. The dual hybrid MTJ/GMR sensor as recited in claim 11 wherein said first and second FM layers are made of Co—Fe.

13. The dual hybrid MTJ/GMR sensor as recited in claim 11 wherein said APC layer is made of ruthenium (Ru).

14. The dual hybrid MTJ/GMR sensor as recited in claim 1 wherein said second AP-pinned layer comprises:

a third FM layer in contact with said spacer layer;

a fourth FM layer; and an APC layer disposed between said third and fourth FM layers.

15. The dual hybrid MTJ/GMR sensor as recited in claim 13 wherein said third and fourth FM layers are made of Co—Fe.

16. The dual hybrid MTJ/GMR sensor as recited in claim 14 wherein said APC layer is made of ruthenium (Ru).

17. A dual hybrid magnetic tunnel junction (MTJ)/giant magnetoresisive (GMR) sensor, comprising:

an MTJ stack including:
A first AFM layer;
a first AP-pinned layer comprising:
a first ferromagnetic (FM) layer;
a second FM layer; and
an antiparallel coupling (APC) layer disposed between said first and second FM layers;
a tunnel barrier layer, said tunnel barrier layer adjacent to and in contact with said second FM layer;
a GMR stack including:
a second AFM layer;
a second AP-pinned layer comprising:
a fourth FM layer in contact with said second AFM layer;
a third FM layer; and
an APC layer disposed between said third and fourth FM layers; and
a spacer layer, said spacer layer adjacent to and in contact with said third FM layer; and
a ferromagnetic free layer disposed between the tunnel barrier layer and the spacer layer.

18. The dual hybrid MTJ/GMR sensor as recited in claim 17 wherein said first and second AFM layers are made of Pt—Mn.

19. The dual hybrid MTJ/GMR sensor as recited in claim 17 wherein said first and second AFM layers are selected from the group of materials consisting of Pt—Mn, Ir—Mn, Pt—Pd—Mn, and Ni—Mn.

20. The dual hybrid MTJ/GMR sensor as recited in claim 17 wherein said tunnel barrier layer is made of $Al_2O_3$.

21. The dual hybrid MTJ/GMR sensor as recited in claim 17 wherein said spacer layer is made of copper (Cu).

22. The dual hybrid MTJ/GMR sensor as recited in claim 21 wherein said spacer layer has a thickness in the range 19–24 Å, said spacer layer providing negative ferromagnetic coupling between said third FM layer and said free layer.

23. The dual hybrid MTJ/GMR sensor as recited in claim 17 wherein said first, second, third and fourth FM layers are made of Co—Fe.

24. The dual hybrid MTJ/GMR sensor as recited in claim 17 wherein said APC layers are made of ruthenium (Ru).

25. A dual hybrid magnetic tunnel junction (MTJ)/giant magnetoresisive (GMR) sensor, comprising:

an MTJ stack including:
an first AFM layer;
a first AP-pinned layer comprising:
a first ferromagnetic (FM) layer;
a second FM layer; and
an antiparallel coupling (APC) layer disposed between said first and second FM layers;
a tunnel barrier layer, said tunnel barrier layer adjacent to and in contact with said second FM layer;
a GMR stack including:
a second AMR layer;
a second AP-pinned layer comprising:
a fifth FM layer in contact with said second AFM layer;
a fourth FM layer;
an APC layer disposed between said fourth and fifth FM layers;
a third FM layer; and
an APC layer disposed between said third and fourth FM layers;
a spacer layer, said spacer layer adjacent to and in contact with said third FM layer; and
a ferromagnetic free layer disposed between the tunnel barrier layer and the spacer layer, said free layer comprising;
a ferromagnetic first sense layer adjacent to said tunnel barrier layer;
a ferromagnetic second sense layer; and
an APC layer layer disposed between said first and second sense layers.

26. The dual hybrid MTJ/GMR sensor as recited in claim 25 wherein said first and second AFM layers are made of Pt—Mn.

27. The dual hybrid MTJ/GMR sensor as recited in claim 25 wherein said first and second AFM layers are selected from the group of materials consisting of Pt—Mn, Ir—Mn, Pt—Pd—Mn, and Ni—Mn.

28. The dual hybrid MTJ/GMR sensor as recited in claim 25 wherein said tunnel barrier layer is made of $Al_2O_3$.

29. The dual hybrid MTJ/GMR sensor as recited in claim 25 wherein said spacer layer is made of copper (Cu).

30. The dual hybrid MTJ/GMR sensor as recited in claim 29 wherein said spacer layer has a thickness in the range 19–24 Å said spacer layer providing negative ferromagnetic coupling between said third FM layer and said second sense layer.

31. The dual hybrid MTJ/GMR sensor as recited in claim 25 wherein said FM layers are made of Co—Fe.

32. The dual hybrid MTJ/GMR sensor as recited in claim 25 wherein said APC layers are made of ruthenium (Ru).

33. A magnetic read/write head, comprising:

a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a dual hybrid MTJ/GMR sensor and first and second shield layers, the MTJ/GMR sensor being sandwiched between the first and second shield layers, the MTJ/GMR sensor including:
an MTJ stack including:

a first AFM layer;
a first AP-pinned layer comprising:
a first ferromagnetic (FM) layer;
a second FM layer; and
an antiparallel coupling (APC) layer disposed between said first and second FM layers;
a tunnel barrier layer, said tunnel barrier layer adjacent to and in contact with said second FM layer;
a GMR stack including:
a second AFM layer;
a second AP-pinned layer comprising:
a fourth FM layer in contact with said second AFM layer;
a third FM layer; and
an APC layer disposed between said third and fourth FM layers; and
a spacer layer, said spacer layer adjacent to and in contact with said third FM layer; and
a ferromagnetic free layer disposed between the tunnel barrier layer and the spacer layer; and
an insulation layer disposed between the second shield layer of the read head and the first pole piece layer of the write head.

34. The magnetic read/write head as recited in claim 33 wherein said first and second AFM layers are made of Pt—Mn.

35. The magnetic read/write head as recited in claim 33 wherein said first and second AFM layers are selected from the group of materials consisting of Pt—Mn, Ir—Mn, Pt—Pd—Mn, and Ni—Mn.

36. The magnetic read/write head as recited in claim 33 wherein said spacer layer is made of copper (Cu).

37. The magnetic read/write head as recited in claim 36 wherein said spacer layer has a thickness in the range 19–24 Å, said spacer layer providing negative ferromagnetic coupling between said third FM layer and said free layer.

38. A disk drive system comprising:
a magnetic recording disk;
a magnetic read/write head for magnetically recording data on the magnetic recording disk and for sensing magnetically recorded data on the magnetic recording disk, said magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a dual hybrid MTJ/GMR sensor and first and second shield layers, the MTJ/GMR sensor being sandwiched between the first and second shield layers, the MTJ/GMR sensor including:
an MTJ stack including:
a first AFM layer;
a first AP-pinned layer comprising:
a first ferromagnetic (FM) layer;
a second FM layer; and
an antiparallel coupling (APC) layer disposed between said first and second FM layers;
a tunnel barrier layer, said tunnel barrier layer adjacent to and in contact with said second FM layer;
a GMR stack including:
a second AFM layer;
a second AP-pinned layer comprising:
a fourth FM layer in contact with said second AFM layer;
a third FM layer; and
an APC layer disposed between said third and fourth FM layers; and
a spacer layer, said spacer layer adjacent to and in contact with said third FM layer; and
a ferromagnetic free layer disposed between the tunnel barrier layer and the spacer layer;
an insulation layer disposed between the second shield layer of the read head and the first pole piece layer of the write head;
an actuator for moving said magnetic read/write head across the magnetic disk so that the read/write head may access different regions of the magnetic recording disk; and
a recording channel coupled electrically to the write head for magnetically recording data on the magnetic recording disk and to the MTJ/GMR sensor of the read head for detecting changes in resistance of the MTJ/GMR sensor caused by rotation of the magnetization axis of the ferromagnetic free layer relative to the fixed magnetizations of the first and second AP-pinned layers in response to magnetic fields from the magnetically recorded data.

* * * * *